United States Patent
Woo et al.

(10) Patent No.: US 9,780,131 B1
(45) Date of Patent: Oct. 3, 2017

(54) IMAGE SENSOR HAVING GRID PATTERN

(71) Applicant: SK hynix Inc., Gyeonggi-do (KR)

(72) Inventors: Donghyun Woo, Seoul (KR); Yun-Hui Yang, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/454,498

(22) Filed: Mar. 9, 2017

(30) Foreign Application Priority Data

Jul. 28, 2016 (KR) .................. 10-2016-0096032

(51) Int. Cl.
*H01L 27/146* (2006.01)

(52) U.S. Cl.
CPC .. *H01L 27/14623* (2013.01); *H01L 27/14605* (2013.01); *H01L 27/14621* (2013.01); *H01L 27/14627* (2013.01); *H01L 27/14643* (2013.01)

(58) Field of Classification Search
CPC ......... H01L 27/14623; H01L 27/14629; H01L 27/14621; H01L 31/02327
See application file for complete search history.

(56) References Cited

U.S. PATENT DOCUMENTS

| | | | |
|---|---|---|---|
| 8,530,266 B1* | 9/2013 | Chen | H01L 27/14623 257/291 |
| 8,970,768 B2 | 3/2015 | Ahn et al. | |
| 9,412,774 B2* | 8/2016 | Choi | H01L 27/14621 |

* cited by examiner

*Primary Examiner* — Mark Prenty
(74) *Attorney, Agent, or Firm* — IP & T Group LLP

(57) ABSTRACT

An image sensor may include a substrate having a photoelectric conversion element and a grid pattern formed over the substrate and having a flat upper surface, a first side surface, and a second side surface, wherein the first side surface and the second side are located opposite to each other. A first internal angle is formed between the flat upper surface and the first side surface, a second internal angle is formed between the flat upper surface and the second side surface, and the first internal angle may be smaller than the second internal angle.

20 Claims, 7 Drawing Sheets

IMAGE SENSOR HAVING GRID PATTERN

CROSS-REFERENCE TO RELATED APPLICATION

This application claims priority under 35 U.S.C. §119 to Korean Patent Application No. 10-2016-0096032 filed on Jul. 28, 2016, the disclosure of which is herein incorporated by reference in its entirety.

TECHNICAL FIELD

Exemplary embodiments of the present disclosure relate to a semiconductor device fabrication technology, and more particularly, to an image sensor having a grid pattern.

DISCUSSION OF THE RELATED ART

An image sensor converts an optical image into an electrical signal. Recently, due to developments in the computer and communication industries, a demand for an image sensor with improved performance has increased for various devices, such as digital cameras, camcorders, Personal Communication System (PCS), game machines, security cameras, medical micro-cameras, and robots.

SUMMARY

Various embodiments are directed to an image sensor with improved performance.

In an embodiment, an image sensor may include: a substrate including a photoelectric conversion element; and a grid pattern formed over the substrate and having a flat upper surface, a first side surface, and a second side surface, wherein the first side surface and the second side are located opposite to each other, wherein a first internal angle is formed between the flat upper surface and the first side surface, wherein a second internal angle is formed between the flat upper surface and the second side surface, and wherein the first internal angle may be smaller than the second internal angle.

Furthermore, the image sensor may further include: a color separation element formed over the substrate and formed between the grid pattern; a planarization layer formed over the substrate and covering the grid pattern and the color separation element; and a light focusing element formed over the planarization layer.

Furthermore, the image sensor may further include: a first planarization layer formed over the substrate, wherein the grid pattern is formed in the first planarization layer; a color separation element formed over the first planarization layer; a second planarization layer formed over the first planarization layer and covering the color separation element; and a light focusing element formed over the second planarization layer.

Furthermore, the image sensor may further include: a first planarization layer formed over the substrate and including a color separation element; a second planarization layer formed over the first planarization layer, wherein the grid pattern is formed in the second planarization layer; and a light focusing element formed over the second planarization layer.

The first side surface may be a side surface facing the direction of travel of incident light. The first internal angle may be 90°, and the first side surface includes a vertical side surface. The second internal angle may be greater than 90°, and the second side surface includes an inclined side surface. The second internal angle may be 90°+α. The α may be an incident angle of the incident light entering the photoelectric conversion element. The grid pattern may have a trapezoidal cross-section with one vertical side surface.

In an embodiment, an image sensor may include: a pixel array including a plurality of unit pixels arranged in a matrix shape. Each of the plurality of unit pixels include: a substrate including a photoelectric conversion element; and a grid pattern formed over the substrate and having a flat upper surface, a first side surface, and a second side surface, wherein the first side surface and the second side are located opposite to each other, wherein a first internal angle is formed between the flat upper surface and the first side surface, wherein a second internal angle is formed between the flat upper surface and the second side surface, wherein the first internal angle is smaller than the second internal angle, and wherein the second internal angle has a value corresponding to a Chief Ray Angle (CRA) of each of the plurality of unit pixels depending on a position in the pixel array.

Furthermore, each of the plurality of unit pixels may further include: a color separation element formed over the substrate and formed between the grid pattern; a planarization layer formed over the substrate and covering the grid pattern and the color separation element; and a light focusing element formed over the planarization layer.

Furthermore, each of the plurality of unit pixels may further include: a first planarization layer formed over the substrate, wherein the grid pattern is formed in the first planarization layer; a color separation element formed over the first planarization layer; a second planarization layer formed over the first planarization layer and covering the color separation element; and a light focusing element formed over the second planarization layer.

Furthermore, each of the plurality of unit pixels may further include: a first planarization layer formed over the substrate and including a color separation element; a second planarization layer formed over the first planarization layer, wherein the grid pattern is formed in the second planarization layer; and a light focusing element formed over the second planarization layer.

The grid pattern of each of the plurality of unit pixels may be configured such that a line width of the flat upper surface thereof is constant regardless of the position in the pixel array. The grid pattern of each of the plurality of unit pixels may be configured such that a line width of the flat upper surface thereof varies according to the CRA depending on the position in the pixel array. As the CRA is increased, the line width of the flat upper surface may be reduced. The first side surface may be a side surface facing the direction of travel of incident light. The first internal angle may be 90°, and the first side surface includes a vertical side surface. The second internal angle may be greater than 90°, and the second side surface includes an inclined side surface. The second internal angle may be 90°+α, and α may have a value corresponding to the CRA.

DETAILED DESCRIPTION

Figure 1:
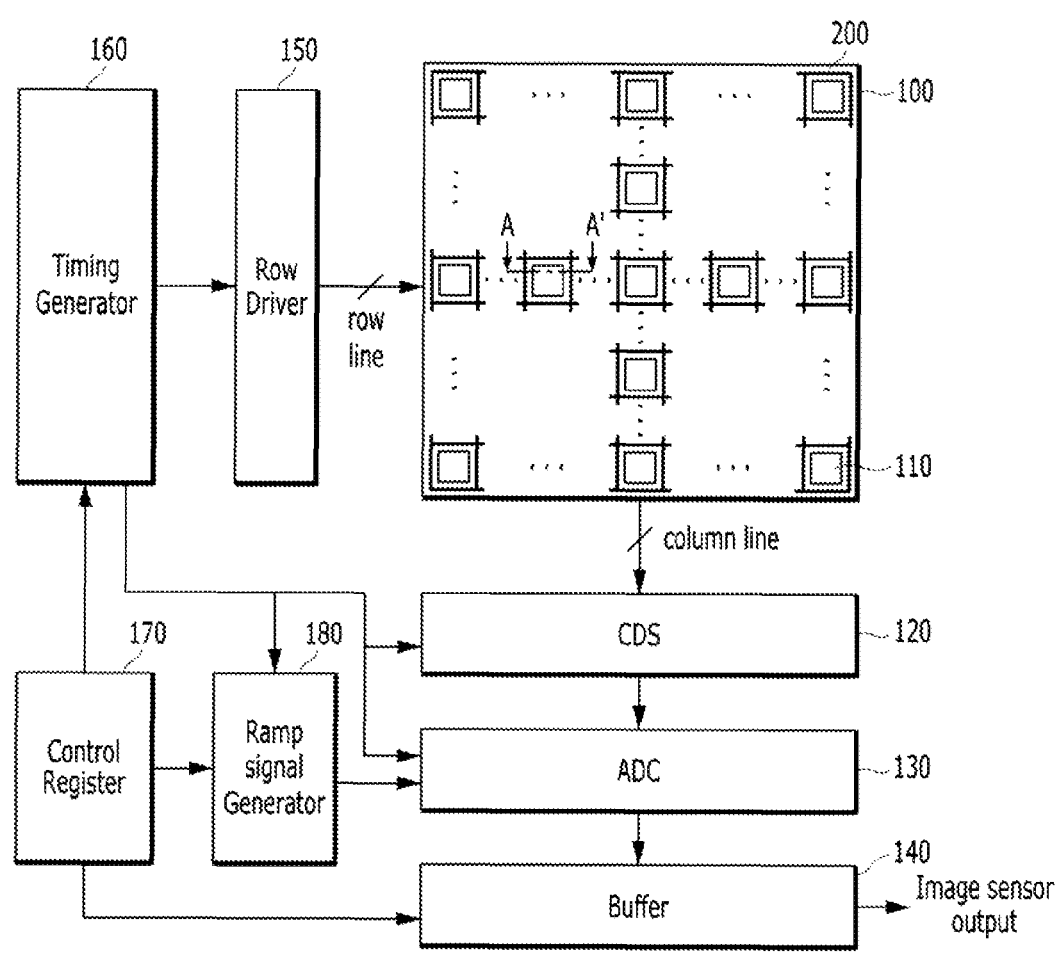
FIG. 1 is a block diagram schematically illustrating an image sensor in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments provide an image sensor having enhanced performance. Particularly, the embodiments relate to a method of enhancing the performance of an image sensor having a grid pattern. For reference, the grid pattern has been introduced to prevent optical crosstalk in which incident light is Irradiated onto other adjacent unit pixels. The grid pattern needs a minimum line width capable of preventing incident light from passing therethrough. The greater the line width of the grid pattern, the more effectively the optical crosstalk can be prevented.

In detail, the following various embodiments provide an image sensor with improved shading variations. Shading variations are caused by a difference in quantity of incident light depending on the position in a pixel array and may become an immediate cause of deterioration in image quality. That is, as a difference between the quantity of incident light irradiated onto unit pixels disposed on a central portion of the pixel array and the quantity of incident light irradiated onto unit pixels disposed along edges of the pixel array is increased, the shading variations may be exacerbated. Moreover, a difference in quantity of incident light depending on the position in the pixel array may be caused by an increase of a Chief Ray Angle (CRA).

With regard to the description of embodiments, image sensors are devices which convert an optical image into an electric signal and may be classified into a Charge Coupled Device (CCD) and a complementary metal oxide semiconductor image sensor (CIS).

Compared to the CCD, the CIS may be simpler in its operating method and adopt various scanning methods. Furthermore, a circuit for signal processing may be easily integrated on a single chip through a CMOS process, and the production cost may be reduced due to low power consumption. Due to the above-mentioned advantages, research on the CIS and development of related products have become appreciably more active. CISs may be classified into a front-side illumination type and a back-side illumination type. Compared to the front-side illumination type CIS, the back-side illumination type CIS may have superior operating characteristics, for example, sensitivity. Therefore, the following embodiments will be described for illustrative purposes based on the back-side illumination type CIS. This means that the technical spirit of the present disclosure may also be applied to the CCD and the front-side illumination type CIS.

FIG. 1 is a block diagram schematically illustrating an image sensor in accordance with an embodiment. As illustrated in FIG. 1, the image sensor in accordance with an embodiment may include a pixel array 100, a correlated double sampling (CDS) 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix shape, and grid patterns 200 arranged in a mesh shape.

The timing generator 160 may generate one or more control signals for controlling operations of each of the row driver 150, the CDS 120, the ADC 130, and the ramp signal generator 180. The control register 170 may generate one or more control signals for controlling operations of each of the ramp signal generator 180, the timing generator 160, and the buffer 140.

The row driver 150 may drive the pixel array 100 on a row line basis. For example, the row driver 150 may generate a select signal for selecting any one row line among a plurality of row lines. Each of the unit pixels 110 may sense incident light and output an image reset signal and an image signal to the CDS 120 through a column line. The CDS 120 may perform sampling for each of the received image reset signals and image signals.

The ADC 130 may compare a ramp signal outputted from the ramp signal generator 180 with a sampling signal outputted from the CDS 120, and output a comparison signal. According to a clock signal provided from the timing generator 160, the ADC 130 may count a level transition time of the comparison signal, and output a count value to the buffer 140. The ramp signal generator 180 may operate under control of the timing generator 160.

The buffer 140 may store a plurality of digital signals outputted from the ADC 130, and then sense and amplify each of the digital signals. Thus, the buffer 140 may include a memory (not shown) and a sense amplifier (not shown). The memory may store count values. The count values may refer to count values related to signals outputted from the plurality of unit pixels 110. The sense amplifier may sense and amplify each of the count values outputted from the memory.

In the above-described image sensor, to improve shading variations, a unit pixel 110 may include the grid pattern 200 which has an inclined side surface corresponding to a chief ray angle (CRA). The CRA varies depending on a position of a given unit pixel in the pixel array 100. The grid pattern 200 in accordance with an embodiment may improve the shading variations, prevent optical crosstalk between adjacent unit pixels 110, and prevent a reduction in amount of incident light caused by the grid pattern 200, thus enhancing quantum efficiency. Hereinafter, an image sensor having the grid pattern 200 in accordance with the embodiment will be described in detail with reference to the attached drawings.

Figure 2:
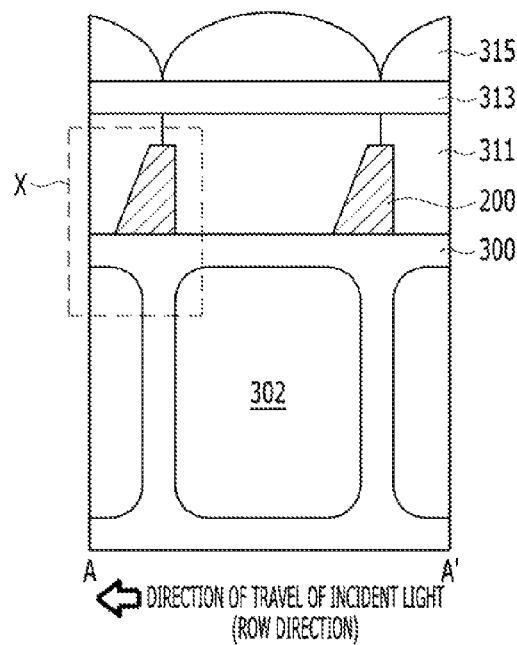
FIG. 2 is a sectional view taken along the line A-A' of FIG. 1 to illustrate a unit pixel of an image sensor in accordance with a first embodiment.
Figure 3:
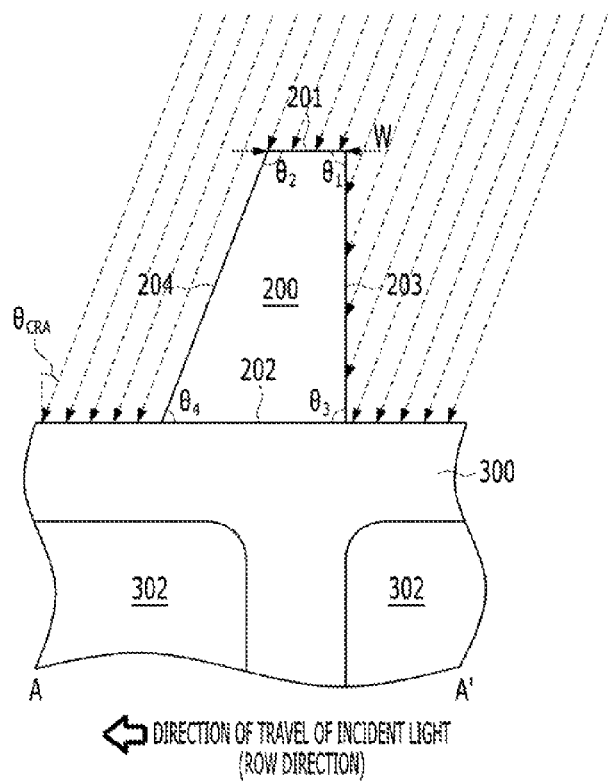
FIG. 3 is a sectional view showing an enlargement of the region 'X' of FIG. 2 to illustrate a grid pattern in accordance with an embodiment.

FIG. 2 is a sectional view taken along the line A-A' of FIG. 1 to illustrate a unit pixel of an image sensor in accordance with a first embodiment. FIG. 3 is a sectional view showing an enlargement of the region 'X' shown in FIG. 2 to illustrate a grid pattern 200 in accordance with an embodiment.

With regard to the detailed description of the drawings, the arrow in a thick solid line, shown in each of FIGS. 2 and 3, indicates a direction in which incident light travels through a two-dimensional plane or the pixel array 100. An example of the case where incident light travels in a row direction is illustrated in the drawings. The arrows in broken lines shown in FIG. 3 indicate incident light irradiated onto a photoelectric conversion element 302 at a predetermined incident angle $\theta_{CRA}$. For reference, the incident angle $\theta_{CRA}$ or chief ray angle (CRA) of incident light refers to an angle between the incident light and a normal line. The normal line is perpendicular to an upper surface of a substrate 300.

As shown in FIGS. 2 and 3, the unit pixel 110 of the image sensor in accordance with the first embodiment may include the substrate 300, a grid pattern 200, a color separation element 311, a planarization layer 313, and a light focusing element 315. The substrate 300 may include the photoelectric conversion element 302. The grid pattern 200 may be formed on the substrate 300 and have a trapezoidal shape in a cross-section with one vertical side surface. The color separation element 311 may be formed on the substrate 300 and gap-filled between portions of the grid pattern 200. The planarization layer 313 may be formed on the color separation element 311. The light focusing element 315 may be formed on the planarization layer 313.

The substrate 300 may include a semiconductor substrate. The semiconductor substrate 300 may have a single crystal state and include a silicon-containing material. That is, the substrate 300 may include a single-crystal silicon-containing material.

The photoelectric conversion element 302 may include an organic or inorganic photodiode. The photoelectric conversion element 302 may be formed on the substrate 300 or in the substrate 300. For example, the photoelectric conversion element 302 may include a plurality of photoelectric conversion layers (not shown) which are formed on the substrate 300 and vertically overlapped with each other. Each of the photoelectric conversion layers may include an N-type impurity region and a P-type impurity region. The N-type impurity region and the P-type impurity region may be formed through an ion-implantation process.

The grid pattern 200 may have a trapezoidal cross-section with one vertical side surface with respect to one direction so as to improve shading variations. In this regard, the one direction may be a direction of travel of incident light. That is, the grid pattern 200 may have an inclined side surface and a vertical side surface. The side surface that faces the direction of travel of incident light may be the vertical side surface, and the side surface that is opposite to the vertical side surface may be the inclined side surface. The inclined side surface may be in parallel to a direction in which incident light enters into an upper surface of the photoelectric conversion element. That is, the inclination of the inclined side surface may have a value corresponding to the incident angle $\theta_{CRA}$ or the CRA of incident light. Depending on the respective positions of the unit pixels 110 in the pixel array 100, the direction of travel of incident light may be changed. The grid pattern 200 may have two side surfaces with respect to the direction of travel of incident light.

In detail, the grid pattern 200 may have a flat upper surface 201 and have first side surface 203 and a second side surface 204 with respect to one direction. For example, the one direction may be the direction of travel of incident light, as shown in the drawing. The first side surface 203 may refer to a side surface that faces the direction of travel of incident light. That is, the first side surface 203 may be angled with respect to the direction of travel of incident light. See FIG. 3. The second side surface 204 may be a side surface that is opposite to the first side surface 203 with respect to the direction of travel of incident light. With regard to the grid pattern 200, a first internal angle $\theta_1$ between the flat upper surface 201 and the first side surface 203 may be less than a second internal angle $\theta_2$ between the flat upper surface 201 and the second side surface 204 ($\theta_1 < \theta_2$). Under this structure, shading variations, which may be caused by the grid pattern 200, may improve. Thus, it is possible to secure a minimum line width capable of preventing incident light from passing through the grid pattern 200 and a maximum line width capable of preventing an optical crosstalk. Within the maximum line width, a reduction in quantity of incident light, which may result from the grid pattern 200, can be prevented. In an embodiment, the flat upper surface 201 of the grid pattern 200 may have the minimum line width.

In more detail, the first internal angle $\theta_1$, which is formed between the flat upper surface 201 and the first side surface 203, may be 90°. Therefore, the first side surface 203 may be vertical with respect to the upper surface of the substrate 300 and may also be referred to as a vertical side surface. In an embodiment, the upper surface of the substrate 300 also serves as a bottom surface 202 of the grid pattern 200. The second internal angle $\theta_2$, which is formed between the flat upper surface 201 and the second side surface 204, may be greater than 90°. Therefore, the second side surface 204 may also be referred to as an inclined side surface. For example, the second internal angle $\theta_2$ may be 90°+α. α may be the same as the CRA. The CRA is an incident angle $\theta_{CRA}$. The CRA is measured with respect to a vertical line which is perpendicular to the upper surface of the substrate 300. A CRA of a given unit pixel 110 varies depending on a position of the given unit pixel 110 in the pixel array 100. This is due to geometric characteristics resulting from the cross-sectional shape of the grid patter 200. That is, the sum of the second internal angle $\theta_2$ and a fourth internal angle $\theta_4$ between the second side surface 204 and the bottom surface 202 of the grid pattern 200 is 180°. For reference, the sum of the first internal angle $\theta_1$ and a third internal angle $\theta_3$ between the first side surface 203 and the bottom surface 202 of the grid pattern 200 may also be 180°.

The grid pattern 200 may be disposed between the plurality of unit pixels 110 and have a shape in which it encloses a portion or the entirety of each photoelectric conversion element 302. Therefore, the grid pattern 200 may be disposed between the photoelectric conversion elements 302 and not be overlapped with adjacent photoelectric conversion elements 302. Alternatively, the grid pattern 200 may be disposed between the photoelectric conversion elements 302 and be partially overlapped with one or two adjacent photoelectric conversion elements 302. The grid pattern 200 may be formed between adjacent color separation elements 311 or between adjacent light focusing elements 315.

The grid pattern 200 may Include a light shielding material or light absorbing material. The light shielding material may include a metallic material. For example, the light shielding material may include tungsten. The light absorbing material may include a carbon-containing material. For example, the light absorbing material may include silicon carbide (SIC). The grid pattern 200 may have a single layer structure or a multi-layer structure.

In an embodiment, the bottom surface 202 of the grid pattern 200 is flat as Illustrated in the drawing. However, in another embodiment, the bottom surface 202 of the grid pattern 200 may have various shapes. For example, the bottom surface 202 of the grid pattern 200 may have an uneven surface shape. In detail, when the grid pattern 200 fills in a trench which is formed in the substrate 300, the bottom surface 202 of the grid pattern 200 may end up with an uneven surface shape.

The color separation element 311 may include a color filter. The grid pattern 200 may function as a separation layer for the color separation element 311. Thereby, optical crosstalk may be prevented, and color mixture or false color may also be prevented from being caused. The planarization layer 313 on the color separation element 311 may function to remove a stepped structure caused by the color separation element 311 and provide a flat basal surface for the light focusing element 315. The planarization layer 313 may include a transparent insulating material. The light focusing element 315 may include a micro-lens, an on-chip lens or a digital lens. The micro-lens may be a hemispherical lens.

As described above, in the grid pattern 200, the first side surface 203 which is angled with incident light may effectively prevent optical crosstalk and may have a vertical side surface. The second side surface 204 that is located opposite to the first side surface 203 may have an inclined side surface and be parallel to incident light. The grid pattern 200 may secure the minimum line width of the grid pattern 200 and is optimized to have the maximum line width.

Figure 4:
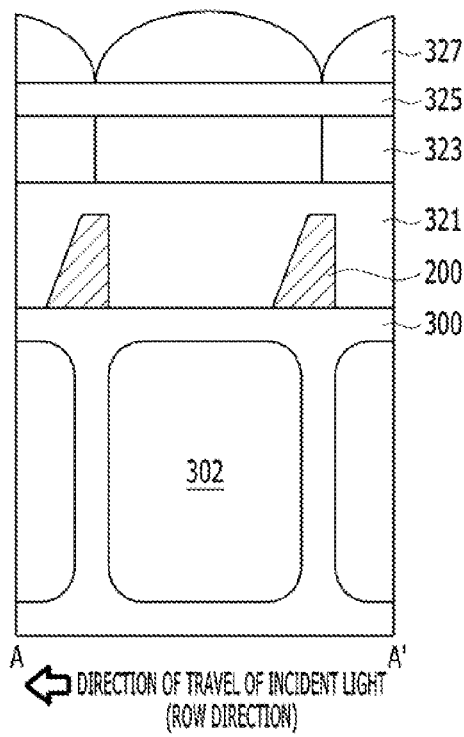
FIG. 4 is a sectional view taken along the line A-A' of FIG. 1 to illustrate a unit pixel of an image sensor in accordance with a second embodiment.

FIG. 4 is a sectional view taken along the line A-A' of FIG. 1 to illustrate a unit pixel of an image sensor in accordance with a second embodiment. The same reference numerals will be used to indicate the same or the like parts as those of the first embodiment, and detailed descriptions thereof will be omitted.

As shown in FIG. 4, the unit pixel 110 of the image sensor in accordance with the second embodiment may include a substrate 300, a first planarization layer 321, a color separation element 323, a second planarization layer 325 and a light focusing element 327. The substrate 300 may include a photoelectric conversion element 302. The first planarization layer 321 may be formed on the substrate 300 and provided with a grid pattern 200. The color separation element 323 may be formed on the first planarization layer 321. The second planarization layer 325 may be formed on the color separation element 323. The light focusing element 327 may be formed on the second planarization layer 325. In this regard, the grid pattern 200 may be formed between adjacent color separation elements 323 or between adjacent light focusing elements 327.

The first planarization layer 321 is formed to cover the grid pattern 200 or have the same surface level as that of a flat upper surface 201 of the grid pattern 200. The first planarization layer 321 may function to remove a stepped structure caused by the grid pattern 200 and provide a flat basal surface for the color separation element 323. The color separation element 323 may include a color filter. The second planarization layer 325 may function to remove a stepped structure caused by the color separation element 323 and provide a flat basal surface for the light focusing element 327. Each of the first and second planarization layers 321 and 325 may include a transparent insulating material. The light focusing element 327 may include a micro-lens or digital lens.

Figure 5:
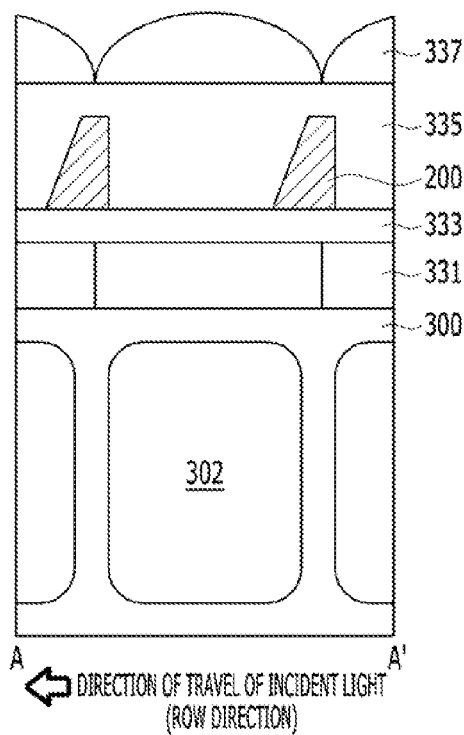
FIG. 5 is a sectional view taken along the line A-A' of FIG. 1 to illustrate a unit pixel of an image sensor in accordance with a third embodiment.

FIG. 5 is a sectional view taken along the line A-A' of FIG. 1 to Illustrate a unit pixel of an image sensor in accordance with a third embodiment. The same reference numerals will be used to indicate the same or the like parts as those of the first embodiment, and detailed descriptions thereof will be omitted.

As shown in FIG. 5, the unit pixel 110 of the image sensor in accordance with the third embodiment may include a substrate 300, a color separation element 331, a first planarization layer 333, a grid pattern 200, a second planarization layer 335 and a light focusing element 337. The substrate 300 may include a photoelectric conversion element 302. The color separation element 331 may be formed on the substrate 300. The first planarization layer 333 may be formed on the color separation element 331. The grid pattern 200 may be formed on the first planarization layer 333. The second planarization layer 335 may be formed on the first planarization layer 333 and provided with the grid pattern 200 formed in the second planarization layer 335. The light focusing element 337 may be formed on the second planarization layer 335. In this regard, the grid pattern 200 may be formed between adjacent color separation elements 331 or between adjacent light focusing elements 337.

The color separation element 331 may include a color filter. The first planarization layer 333 may function to remove a stepped structure caused by the color separation element 331 and provide a flat basal surface for the grid pattern 200. The second planarization layer 335 is formed to cover the grid pattern 200 or have a top surface which is located at the same level as the flat upper surface 201 of the grid pattern 200. The second planarization layer 335 may function to remove a stepped structure caused by the grid pattern 200 and provide a flat basal surface for the light focusing element 327. Each of the first and second planarization layers 333 and 335 may include a transparent insulating material. The light focusing element 337 may include a micro-lens or digital lens.

Hereinafter, a structure will be described in which the second internal angle between the second side surface and the flat upper surface of the grid pattern of the unit pixel corresponds to the CRA to improve shading variations. For example, a unit pixel of the image sensor shown in FIG. 6 may have the same structure as the first embodiment described above.

Figure 6:
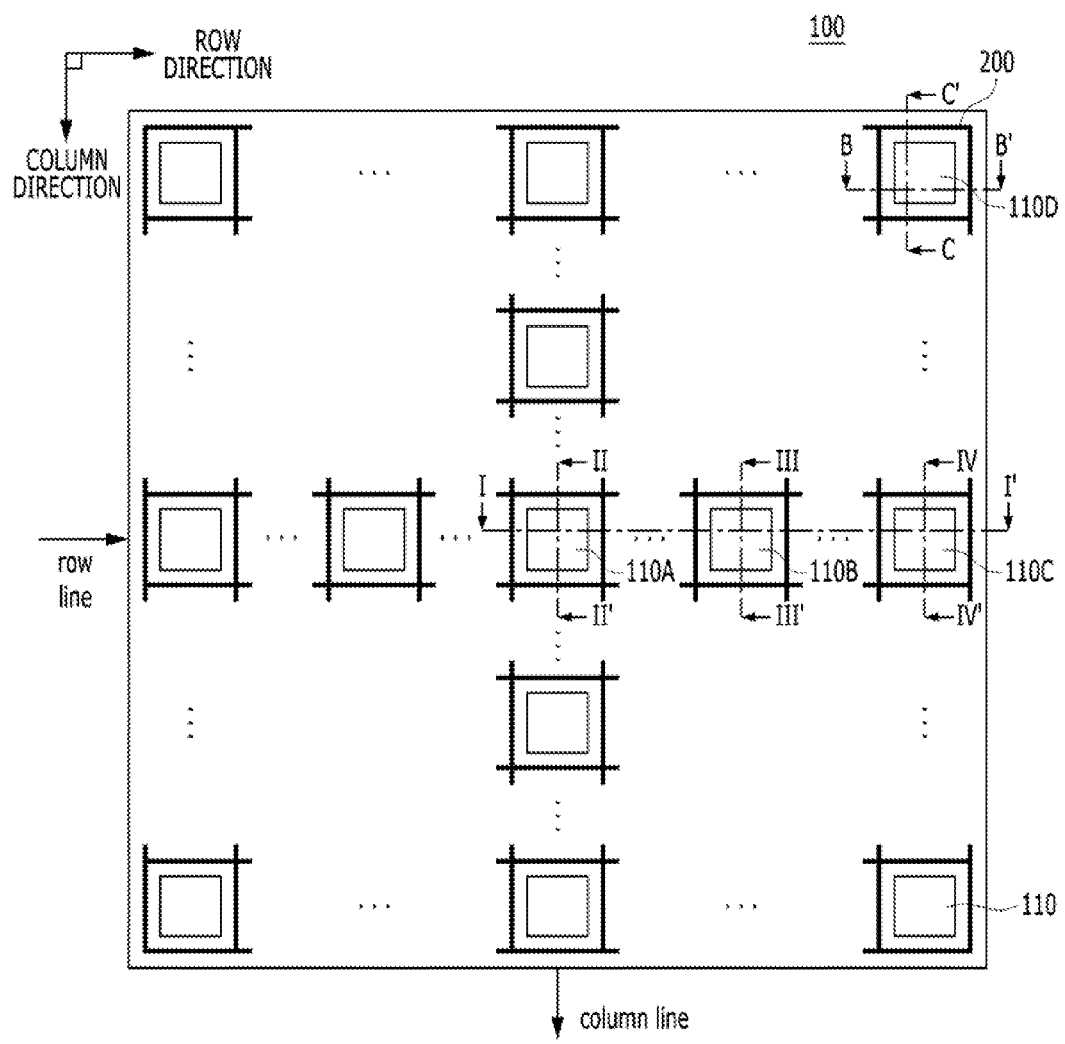
FIG. 6 is a plan view Illustrating a pixel array of an image sensor in accordance with an embodiment.

FIG. 6 is a plane view illustrating a pixel array of an image sensor in accordance with the present embodiment and shows an enlargement of the pixel array shown in FIG. 1. Referring to FIG. 6, in the image sensor in accordance with the embodiment, a unit pixel 110 disposed in the center of the pixel array 100 refers to a 'first pixel 110A'. A unit pixel 110 that is disposed at the outermost position of the pixel array 100 and located at the same row as the first pixel 110A refers to a 'third pixel 110C'. A unit pixel 110 that is disposed between the first pixel 110A and the third pixel 110C and located at the same row as the first pixel 110A and the third pixel 110C refers to a 'second pixel 110B'. A unit pixel 110 that is disposed at an upper right corner of the pixel array 100 refers to a 'fourth pixel 110D'.

Figure 7:
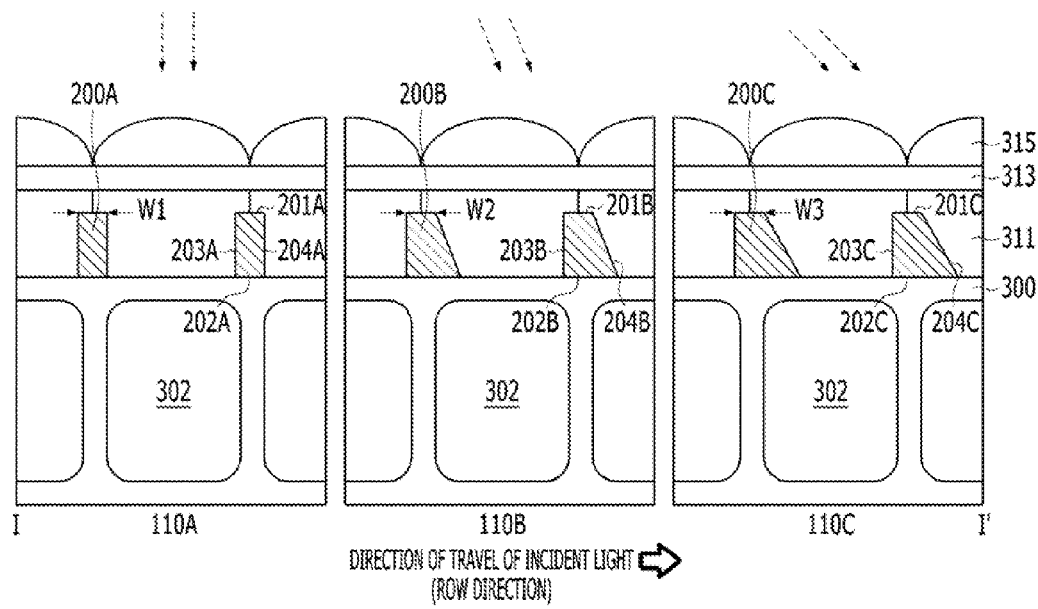
FIG. 7 is a sectional view taken along the line I-I' of FIG. 6 to illustrate an image sensor in accordance with an embodiment.

FIG. 7 is a sectional view taken along the line I-I' of FIG. 6 to illustrate an image sensor in accordance with the present embodiment. As shown in FIGS. 6 and 7, the image sensor in accordance with an embodiment may include a pixel array 100 in which a plurality of unit pixels 110 are arranged in a matrix shape. Each of the unit pixels 110 may include a substrate 300, a grid pattern 200, a color separation element 311, a planarization layer 313, and a light focusing element 315. The substrate 300 may include a photoelectric conversion element 302. The grid pattern 200 may be formed on the substrate 300 and have a trapezoidal cross-section with one vertical side surface. The color separation element 311 may be formed on the substrate 300. The grid pattern 200 is located between two neighboring color separation elements 311. The planarization layer 313 may be formed on the color separation element 311. The light focusing element 315 may be formed on the planarization layer 313.

In detail, for each of the unit pixels 110, the grid pattern 200 may include a flat upper surface 201 and have a first side surface 203 and a second side surface 204. A first internal angle between the flat upper surface 201 and the first side surface 203 may be less than a second internal angle between the flat upper surface 201 and the second side surface 204. The second internal angle may correspond to the CRA of a given unit pixel 110. The CRA varies depending on a position of the given unit pixel 110.

In more detail, incident light is irradiated onto the first pixel 110A in a direction perpendicular to the substrate 300. That is, the CRA on the first pixel 110A may be 0°. A first internal angle between a flat upper surface 201A and a first side surface 203A may be the same as a second internal angle between the flat upper surface 201A and a second side surface 204A. Therefore, each of the first and second side surfaces 203A and 204A may be a vertical side surface.

Incident light irradiated onto each of the second and third pixels 110B and 110C may have a predetermined CRA which is greater than zero. Incident lights irradiated onto the second pixel 110B and the third pixel 110C may have different CRAs. The CRA of incident light irradiated onto the third pixel 110C may be greater than the CRA of incident light irradiated onto the second pixel 110B. Hence, a first internal angle between a flat upper surface 201B, 201C and a first side surface 203B, 203C may be less than a second internal angle between the flat upper surface 201B, 201C and a second side surface 204B, 204C. Thus, the first side surface 203B, 203C may be a vertical side surface, and the second side surface 204B, 204C may be an inclined side surface.

The second pixel 110B may have a smaller CRA than the third pixel 110C and a greater CRA than the first pixel 110A. Therefore, the second internal angle of the second grid pattern 200B may be less than the second internal angle of the third grid pattern 200C and greater than the second internal angle of the first grid pattern 200A. The line widths of the flat upper surfaces 201A, 201B and 201C of the first to third grid patterns 200A to 200C may be the same as each other (W1=W2=W3).

While the line widths of the flat upper surfaces 201A, 201B and 201C of the first to third grid patterns 200A to 200C are the same as each other, the line width of the bottom surface 202 of the grid pattern 200 may be gradually increased from the center of the pixel array 100 to an edge thereof. That is, as the CRA of each of the unit pixels 110 in the pixel array 100 is increased, the line width of the bottom surface 202 of the grid pattern 200 corresponding to each unit pixel 110 may be increased. Furthermore, the line width of the bottom surface 202B of the second grid pattern 200B may be greater than the line width of the bottom surface 202A of the first grid pattern 200A. The line width of the bottom surface 202C of the third grid pattern 200C may be greater than the line width of the bottom surface 202B of the second grid pattern 200B.

As described above, the grid pattern 200 including the first side surface 203 and the second side surface 204 may prevent optical crosstalk, may secure the minimum line width of the grid pattern 200 required in the device, and may be optimized to have the maximum line width so that the quantity of incident light is not reduced.

Thereby, the shading variations may be improved, and the quantum efficiency may be enhanced.

Figure 8:
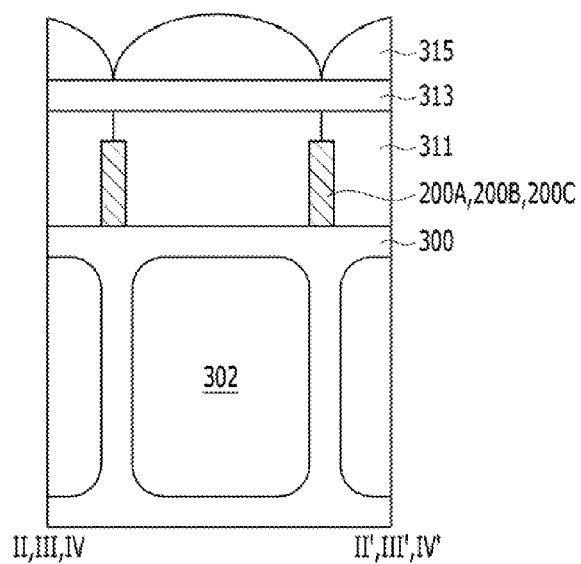
FIG. 8 is a sectional view taken along the line II-II', the line III-III' and the line IV-IV' of FIG. 6 to illustrate the image sensor in accordance with an embodiment.

FIG. 8 is a sectional view taken along the line II-II', the line III-III' and the line IV-IV' of FIG. 6. The sectional views taken along the line II-II', the line III-III', and the line IV-IV' are the same as each other. Thus, only one sectional view is shown in FIG. 8 for conciseness.

Figure 9:
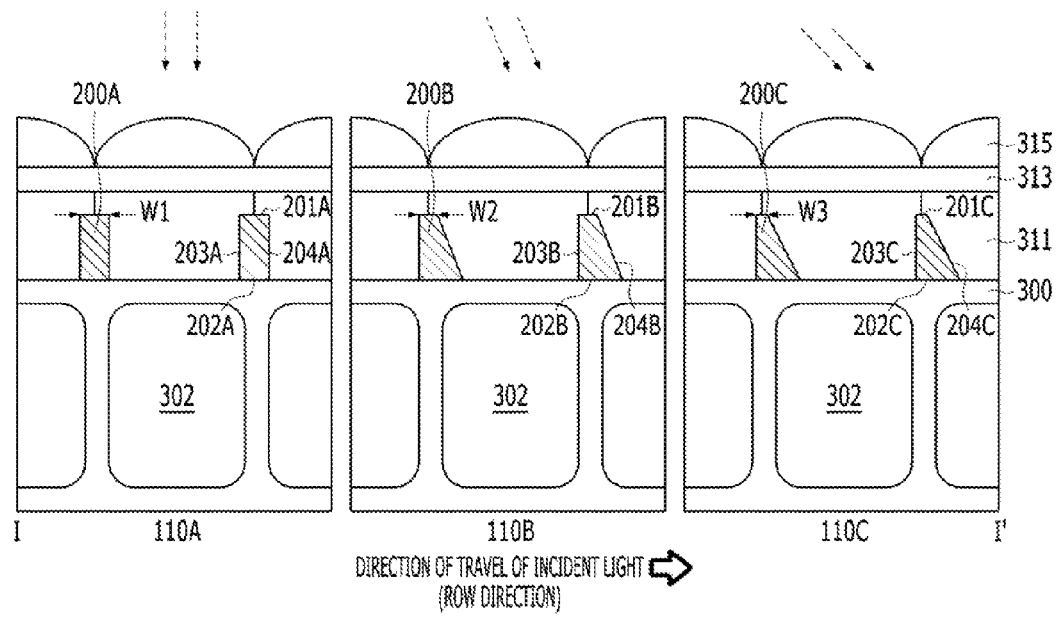
FIG. 9 is a sectional view taken along the line I-I' of FIG. 6 to illustrate a modification of an image sensor in accordance with an embodiment.

Referring to FIGS. 6 and 8, in the image sensor in accordance with the embodiment, the second pixel 110B and the third pixel 110C are disposed on the same row as the first pixel 110A located on the center of the pixel array 100. Thus, the direction of travel of incident light in the second pixel 110B and the third pixel 110C varies in the row direction. Therefore, the second pixel 110B and the third pixel 110C have different CRAs in the row direction from each other. However, no CRA change occurs in the column direction. Thereby, all of the sectional views of the first pixel 110A, the second pixel 110B and the third pixel 110C taken along line II-II', line III-III' and line IV-IV' may be the same. Since incident light irradiated onto the first to third pixels 110A to 110C in the column direction has no CRA, opposite side surfaces of the first to third grid patterns 200A to 200C may be vertical. FIG. 9 is a sectional view taken along the line I-I' of FIG. 6 to illustrate an image sensor in accordance with an embodiment. The same reference numerals as those of the embodiment shown in FIG. 7 denote the same or like features. For concise description, only different configurations will be described.

As shown in FIGS. 6 and 9, the line widths of flat upper surfaces 201 of respective grid patterns 200 of a plurality of unit pixels 110 may be different from each other according to the CRAs which vary depending on positions of given unit pixels 110 in the pixel array 100 (W1≠W2≠W3). As the CRA is increased, the line width W1, W2, W3 of the flat upper surface 201 of the grid pattern 200 may be reduced. That is, the line widths W1, W2 and W3 of the flat upper surfaces 201 of the grid patterns 200 may be gradually reduced from the center of the pixel array 100 to an edge. The line width W2 of a flat upper surface 201B of a second grid pattern 200B may be less than the line width W1 of a flat upper surface 201A of a first grid pattern 200A, and the line width W3 of a flat upper surface 201C of a third grid pattern 200C may be less than the line width W2 of a flat upper surface 201B of a second grid pattern 200B (W1>W2>W3). Under this structure, as the CRA is increased, the quantity of incident light is prevented from being rapidly reduced, whereby the shading variations may be more effectively improved.

Figure 10:
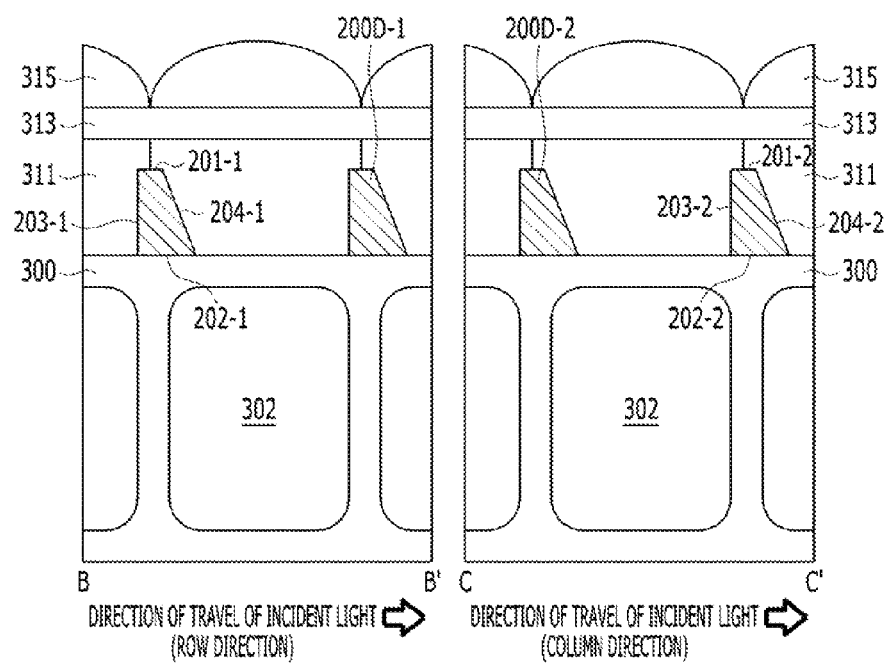
FIG. 10 is a sectional view taken along the line B-B' and the line C-C' of FIG. 6 to illustrate an image sensor in accordance with an embodiment.

FIG. 10 is a sectional view taken along the line B-B' and the line C-C' of FIG. 6 to illustrate an image sensor in accordance with an embodiment. FIG. 10 shows the fourth pixel 110D is disposed on an upper right corner or vertex of the pixel array 100. Incident light may travel in the row direction and the column direction. Therefore, the direction of travel of incident light may be divided into the row direction and the column direction. That is, incident light irradiated onto the fourth pixel 110D may have a predetermined CRA with respect to the row direction and also have a predetermined CRA with respect to the column direction. When the CRA of the row direction and the CRA of the column direction are the same as each other, a second internal angle between flat upper surface 201-1 and second side surface 204-1 of grid patterns 200-1 and 200-2 with respect to the row direction and the column direction may be the same as each other.

The image sensor in accordance with an embodiment of the present invention may be used in various electronic devices or systems. Hereafter, a camera including an image sensor in accordance with an embodiment of the present invention will be described with reference to FIG. 11.

Figure 11:
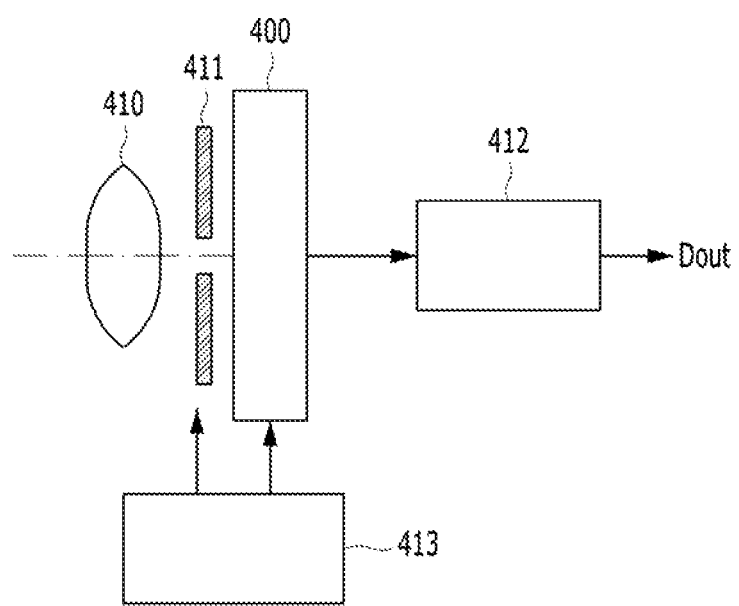
FIG. 11 is a diagram schematically illustrating an electronic device including an image sensor in accordance with an embodiment of the present invention

FIG. 11 is a diagram schematically Illustrating an electronic device including an image sensor in accordance with an embodiment of the present invention. Referring to FIG. 11, the electronic device including an image sensor in accordance with an embodiment of the present invention may be a camera capable of taking a still image or a moving image. The electronic device may include an optical system or optical lens 410, a shutter unit 411, a driving unit 413 for controlling/driving the image sensor 400 and the shutter unit 411, and a signal processing unit 412.

The optical system 410 may guide image light from an object to the pixel array 100 of the image sensor 400. The optical system 410 may include a plurality of optical lenses. The shutter unit 411 may control a light irradiation period and a light shield period for the Image sensor 400. The driving unit 413 may control a transmission operation of the image sensor 400 and a shutter operation of the shutter unit 411. The signal processing unit 412 may process signals outputted from the image sensor 400 in various manners. The processed image signals Dout may be stored in a storage medium such as a memory or outputted to a monitor or the like.

As described above, an image sensor in accordance with various embodiments includes a grid pattern which has an inclined side surface corresponding to a CRA of each of a plurality of unit pixels. The CRA varies depending on a position of a given unit pixel in a pixel array, thus improving shading variations. In addition, optical crosstalk between adjacent unit pixels may be prevented, and the quantum efficiency may be enhanced.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a substrate including a photoelectric conversion element; and
a grid pattern formed over the substrate and having a flat upper surface, a first side surface, and a second side surface, wherein the first side surface and the second side are located opposite to each other,
wherein a first internal angle is formed between the flat upper surface and the first side surface,
wherein a second internal angle is formed between the flat upper surface and the second side surface, and
wherein the first internal angle is smaller than the second internal angle.

2. The image sensor of claim 1, further comprising:
a color separation element formed over the substrate and formed between the grid pattern;
a planarization layer formed over the substrate and covering the grid pattern and the color separation element; and
a light focusing element formed over the planarization layer.

3. The image sensor of claim 1, further comprising:
a first planarization layer formed over the substrate, wherein the grid pattern is formed in the first planarization layer;
a color separation element formed over the first planarization layer;
a second planarization layer formed over the first planarization layer and covering the color separation element; and
a light focusing element formed over the second planarization layer.

4. The Image sensor of claim 1, further comprising:
a first planarization layer formed over the substrate and Including a color separation element;
a second planarization layer formed over the first planarization layer, wherein the grid pattern is formed in the second planarization layer; and
a light focusing element formed over the second planarization layer.

5. The Image sensor of claim 1, wherein the first side surface is a side surface facing the direction of travel of incident light.

6. The image sensor of claim 5, wherein the first internal angle is 90°, and the first side surface includes a vertical side surface.

7. The image sensor of claim 5, wherein the second internal angle is greater than 900, and the second side surface includes an inclined side surface.

8. The image sensor of claim 5, wherein the second internal angle is 90°+α, and
wherein α is an incident angle of the incident light entering the photoelectric conversion element.

9. The image sensor of claim 1, wherein the grid pattern has a trapezoidal cross-section with one vertical side surface.

10. An image sensor comprising:
a pixel array including a plurality of unit pixels arranged in a matrix shape,
wherein each of the plurality of unit pixels comprises:
a substrate including a photoelectric conversion element; and
a grid pattern formed over the substrate and having a flat upper surface, a first side surface, and a second side surface, wherein the first side surface and the second side are located opposite to each other,
wherein a first internal angle is formed between the flat upper surface and the first side surface,
wherein a second internal angle is formed between the flat upper surface and the second side surface,
wherein the first internal angle is smaller than the second internal angle, and
wherein the second internal angle has a value corresponding to a Chief Ray Angle (CRA) of each of the plurality of unit pixels depending on a position in the pixel array.

11. The image sensor of claim 10, wherein each of the plurality of unit pixels further comprising:
a color separation element formed over the substrate and formed between the grid pattern;
a planarization layer formed over the substrate and covering the grid pattern and the color separation element; and
a light focusing element formed over the planarization layer.

12. The image sensor of claim 10, wherein each of the plurality of unit pixels further comprises:
- a first planarization layer formed over the substrate, wherein the grid pattern is formed in the first planarization layer;
- a color separation element formed over the first planarization layer;
- a second planarization layer formed over the first planarization layer and covering the color separation element; and
- a light focusing element formed over the second planarization layer.

13. The Image sensor of claim 10, wherein each of the plurality of unit pixels further comprises:
- a first planarization layer formed over the substrate and including a color separation element;
- a second planarization layer formed over the first planarization layer, wherein the grid pattern is formed in the second planarization layer; and
- a light focusing element formed over the second planarization layer.

14. The image sensor of claim 10, wherein the grid pattern of each of the plurality of unit pixels Is configured such that a line width of the flat upper surface thereof is constant regardless of the position in the pixel array.

15. The image sensor of claim 10, wherein the grid pattern of each of the plurality of unit pixels is configured such that a line width of the flat upper surface thereof varies according to the CRA depending on the position in the pixel array.

16. The image sensor of claim 15, wherein as the CRA is increased, the line width of the flat upper surface is reduced.

17. The image sensor of claim 10, wherein the first side surface is a side surface facing the direction of travel of incident light.

18. The image sensor of claim 17, wherein the first internal angle is 90°, and the first side surface includes a vertical side surface.

19. The image sensor of claim 17, wherein the second internal angle is greater than 90°, and the second side surface includes an inclined side surface.

20. The image sensor of claim 17, wherein the second internal angle is 90°+α, and α has a value corresponding to the CRA.

* * * * *